United States Patent [19]

Kodera et al.

[11] Patent Number: 5,695,601
[45] Date of Patent: Dec. 9, 1997

[54] METHOD FOR PLANARIZING A SEMICONDUCTOR BODY BY CMP METHOD AND AN APPARATUS FOR MANUFACTURING A SEMICONDUCTOR DEVICE USING THE METHOD

[75] Inventors: Masako Kodera, Yokohama; Atsushi Shigeta, Fujisawa, both of Japan; Shiro Mishima, Wappingers Falls, N.Y.; Hiromi Yajima, Yokohama; Riichirou Aoki, Tokyo, both of Japan

[73] Assignee: Kabushiki Kaisha Toshiba, Kawasaki, Japan

[21] Appl. No.: 578,894

[22] Filed: Dec. 27, 1995

[51] Int. Cl.$^6$ ............................................. H01L 21/306
[52] U.S. Cl. ............... 156/636.1; 156/345; 156/626.1; 156/645.1; 216/85; 216/88; 437/228
[58] Field of Search ........................ 156/626.1, 636.1, 156/645.1, 345; 216/84, 85, 88, 89; 437/228

[56] References Cited

U.S. PATENT DOCUMENTS

| 4,680,084 | 7/1987 | Heimann et al. | 156/345 |
|---|---|---|---|
| 5,240,552 | 8/1993 | Yu et al. | 156/636.1 |
| 5,271,796 | 12/1993 | Miyashita et al. | 156/345 |
| 5,413,941 | 5/1995 | Koos et al. | 437/173 |
| 5,433,650 | 7/1995 | Winebarger | 451/6 |
| 5,433,651 | 7/1995 | Lustig et al. | 156/636.1 |
| 5,486,129 | 1/1996 | Sandhu et al. | 451/5 |
| 5,492,594 | 2/1996 | Burke et al. | 216/88 |
| 5,609,511 | 3/1997 | Moriyama et al. | 451/5 |

FOREIGN PATENT DOCUMENTS 63-185574  8/1988  Japan.

*Primary Examiner*—R. Bruce Breneman
*Assistant Examiner*—Anita Alanko
*Attorney, Agent, or Firm*—Finnegan, Henderson, Farabow, Garrett & Dunner, L.L.P.

[57] ABSTRACT

A film formed on a wafer is polished in a CMP unit. Thereafter, the wafer, which is adhered to a wafer holder, is moved to a portion above an optical sensor. A surface of the wafer is radiated with, for example, a visible ray, thereby measuring a thickness of the film which has been polished. A control unit automatically sets a polishing time for polishing a film on a wafer to be polished next.

10 Claims, 3 Drawing Sheets

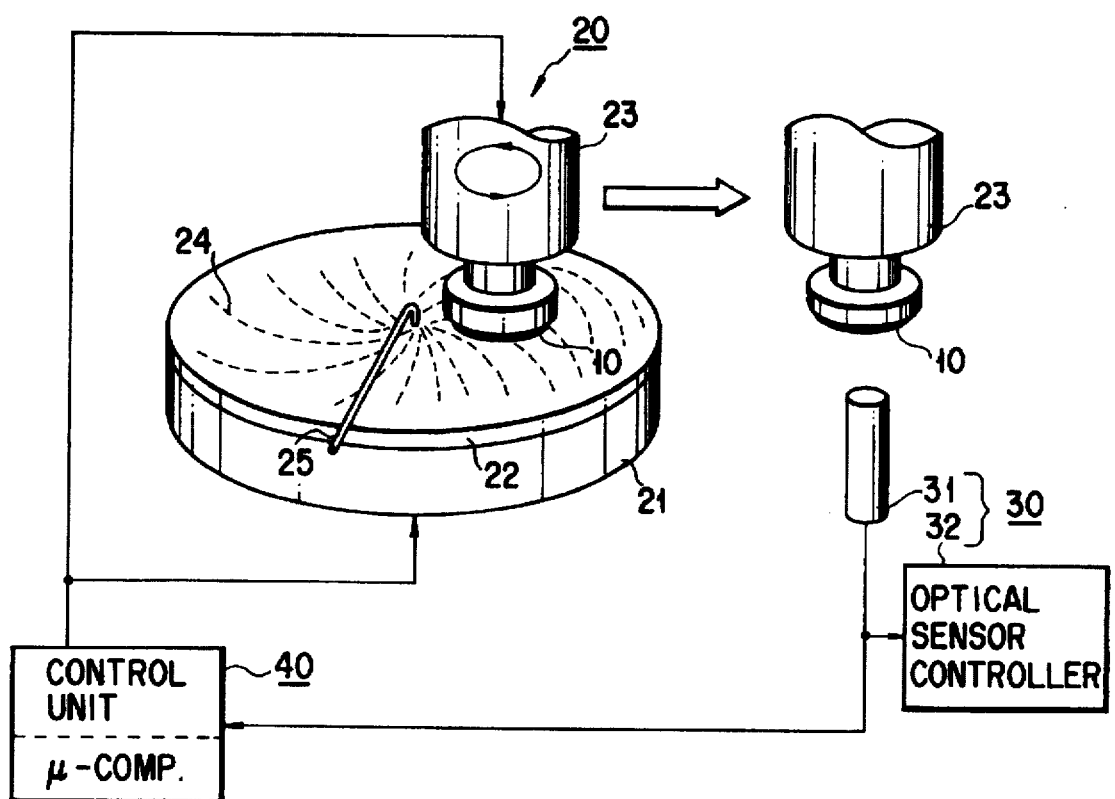
F I G. 3
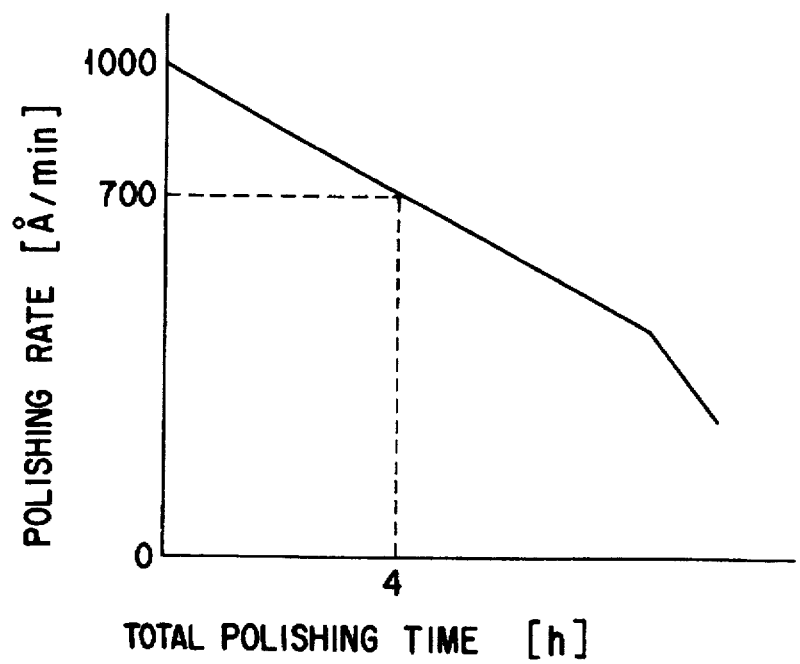
F I G. 5

METHOD FOR PLANARIZING A SEMICONDUCTOR BODY BY CMP METHOD AND AN APPARATUS FOR MANUFACTURING A SEMICONDUCTOR DEVICE USING THE METHOD

BACKGROUND OF THE INVENTION

1. Field of the Invention

The present invention relates generally to planarization of a surface of a semiconductor body, and more particularly to a method for planarizing a surface of a semiconductor body by chemical mechanical polishing (CMP) method and an apparatus for manufacturing a semiconductor device using the method.

2. Description of the Related Art

As the integration density of a semiconductor device has been refined and the integration density thereof becomes higher, difference in level of the surface of the semiconductor device, generated during the manufacturing process, has been greater. A CMP method has attracted public attention as a method for planarizing a surface.

In the CMP method, to planarize a level of 1 μm or smaller, it is necessary to stop polishing accurately to obtain a film of a desired thickness. For this purpose, the polishing time is preset in advance, and the polishing is controlled so as to be stopped when the preset time has elapsed. However, since the polishing rate varies during the polishing, it is difficult to obtain a planarized film of a desired shape.

The polishing rate depends on polishing conditions in the CMP apparatus, such as a slurry, a polishing cloth, a pressure and a rotation rate. It is difficult to maintain these conditions. For example, since the surface of the polishing cloth is changed every time polishing is performed, the polishing rate is lowered. FIG. 5 shows the time-sequential change of the polishing rate. As shown in FIG. 5, at the time (h=0) immediately after the polishing cloth is renewed, the polishing rate is 1000 [Å/min]. When the polishing cloth has been used for 4 hours, the polishing rate is reduced to 700 [Å/min]. When the polishing cloth is continued to be used, the polishing rate is abruptly lowered. Thus, since the surface condition of the polishing cloth is changed every time the polishing is performed, the polishing rate is also changed.

For example, assuming that the polishing time "t" is set in accordance with the polishing rate 1000 [Å/min], and a number of wafers are polished under the conditions. In this case, at first, the wafers are planarized satisfactorily. However, when the polishing rate is reduced to 700 [Å/min] after 4 hours, if the polishing time is still set to "t", a wafer can be polished only 70% of the desired state and difference in level remains.

The polishing rate can be set in consideration of the lowering of the polishing rate. However, since the degree of lowering of the polishing rate is not constant and involves an error, it is difficult to obtain an accurate polishing amount by setting the polishing time only in estimation.

To avoid the undesirable situation as described above, the operator measures the polishing rate and resets the polishing time, each time a certain number of wafers are polished. However, the reset operation requires considerable time and labor, which results in the problem that the throughput of the apparatus is reduced to a half or lower.

SUMMARY OF THE INVENTION

A first object of the present invention is to provide a method for manufacturing a semiconductor device, which allows automatic measuring of the thickness of a film on a surface of a semiconductor body after polishing, setting an optimal polishing time, so that the surface of the semiconductor body can be planarized satisfactorily.

A second object of the present invention is to provide an apparatus of manufacturing a semiconductor device, which can automatically measure the thickness of a film on a surface of a semiconductor body after polishing and set an optimal polishing time.

The above objects can be achieved by the following.

A method for manufacturing a semiconductor device comprising the steps of:

planarizing a film formed on a semiconductor body, by means of CMP method, the film having a difference in level on a surface thereof;

measuring a thickness of a planarized film at a desired position; and calculating a polishing time for polishing a next semiconductor body, based on the measured thickness, and controlling the planarizing step in accordance with the polishing time.

An apparatus for manufacturing a semiconductor device comprising:

a polishing unit for polishing a semiconductor body including a film having a difference in level to be polished;

a measuring unit for measuring a thickness of a polished film; and a control unit for calculating a time required for polishing a next film based on a measurement result measured by the measuring unit and controlling an operation of the polishing unit on the basis of the calculated time.

According to the above method for manufacturing a semiconductor device, a polishing time can be set in accordance with a change in the polishing rate. As a result, a film to be polished can be polished to a desired thickness, so that films can always be planarized satisfactorily. Further, according to the above apparatus for manufacturing a semiconductor device, since polishing of a film, measuring of a film thickness, and setting of a polishing time can be automatically performed in the same apparatus, the throughput of the apparatus can be greatly improved.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment given below, serve to explain the principles of the invention.

FIG. 3 is a perspective view schematically showing the CMP unit and the thickness measuring unit shown in FIG. 2;

FIG. 5 is a graph showing the relationship between the polishing time and the polishing rate.

DETAILED DESCRIPTION OF THE PREFERRED EMBODIMENT

An embodiment of the present invention will be described with reference to the accompanying drawings.

A polishing method of the present invention will be described. First, a film having difference in level, formed on a surface of a wafer as a semiconductor body, is polished by a CMP apparatus. Then, the thickness of the film is measured in the same apparatus, thereby calculating a polishing rate of the first wafer. Thereafter, a new polishing time is set based on the polishing rate. Subsequently, a film formed on a surface of a second wafer is polished in accordance with the newly set polishing time.

Figure 1A:
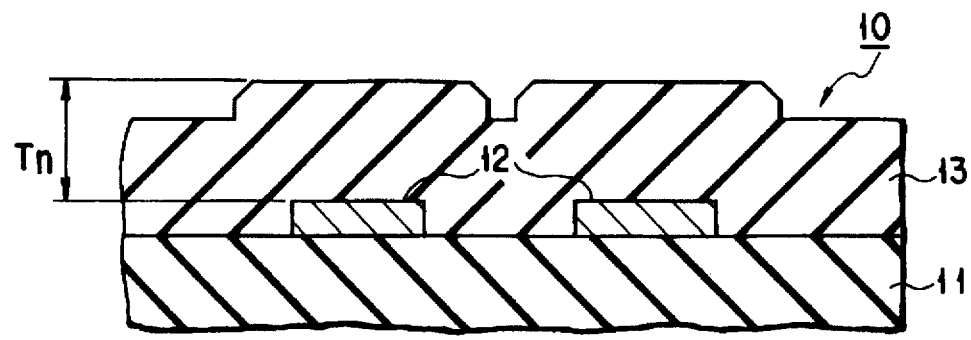
FIG. 1A is a cross-sectional view showing the state of a wafer before polishing.
Figure 1B:
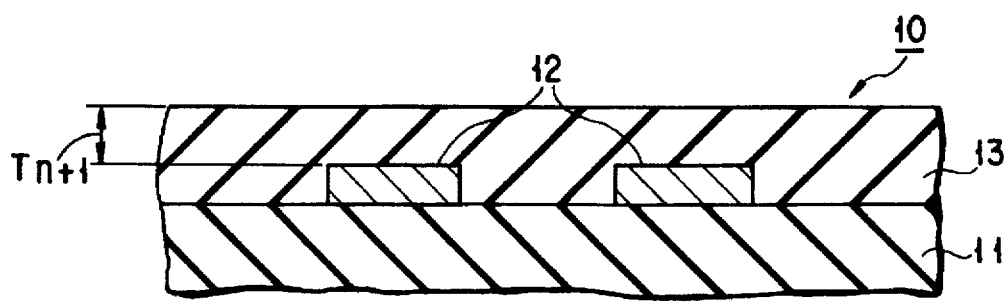
FIG. 1B is a cross-sectional view showing the state of the wafer after polishing.

A method for calculating the polishing rate will now be described. As shown in FIG. 1A, for example, a wafer 10 includes a base film 11, a plurality of wiring lines formed on the base film 11, and a film 13 covering the wiring lines 12 and the base film 11 and having a difference in level on the upper surface. Assume that the thickness of the film 13 before polishing is $T_n$, and the thickness thereof after polishing is $T_{n+1}$ as shown in FIG. 1B. Further, assume that the polishing time, required to polish the film 13 from the thickness $T_n$ to the thickness $T_{n+1}$, is $t_{n+1}$. In this case, the polishing rate $R_{n+1}$ is obtained by the following equation (1):

$$R_{n+1} = k \times (T_n - T_{n+1})/t_{n+1} \qquad (1)$$

where k is a constant.

A method for measuring the thickness of the polished film will be described. A first method is to measure the thickness of the film by optical means. If the film is an insulating film made of $SiO_2$, SiN or the like, or a semiconductor film made of polycrystalline silicon, amorphous silicon or the like, the thickness can be measured by irradiating the film with a visible ray or an infrared ray. In this case, the wavelength of the visible ray may be 200 nm to 800 nm, preferably 480 nm to 790 nm. The wavelength of the infrared ray may be 2.5 µm to 25 µm. The thickness of the film is measured by radiating either ray to the film and detecting the reflected ray from the film. This measurement by means of light can be performed by the conventional method well known to a person skilled in the art.

A second method is to measure the thickness of the polished film by means of an X ray. If the film to be measured is formed of a metal, such as W, Ti, TiN, Al or Cu, an alloy film containing one of these metals, or a laminated film including the metal and the alloy films, then, the thickness of the film can be measured by radiating the film with an X ray by means of the conventional X-ray measuring apparatus. In this case, the X ray should not leak outside the apparatus for manufacturing the semiconductor device. The measurement by means of an X ray can also be performed by the conventional method well known to a person skilled in the art.

A third method is to measure the thickness of the polished film by a well-known sheet resistance measuring apparatus for measuring a sheet resistance. If the polished film is made of a metal or a metal alloy, the thickness thereof can be measured by measuring the resistance of the film.

The measurement can be performed after the polishing, before or during cleaning of the wafer surface; however, it is preferable that the measurement be performed after the surface is cleaned and dried. The polishing agent and polish dust, adhered to the wafer during the polishing process, are removed by the cleaning and drying process, so that the thickness of the film can be measured more accurately.

Figure 4:
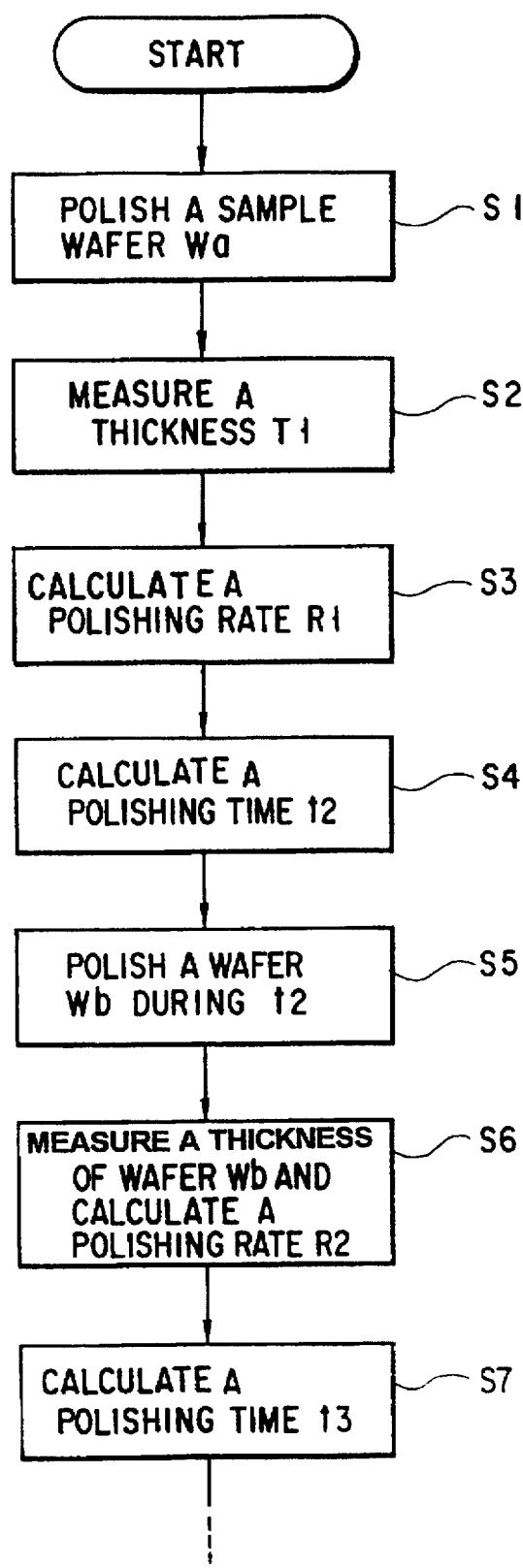
FIG. 4 is flowchart for explaining a polishing method of the present invention.

The aforementioned polishing method will be described in detail referring to FIG. 4. Assume that a plurality of wafers having the same structure are polished. When the polishing cloth of the CMP apparatus is renewed to start polishing, a sample wafer Wa is polished to detect a polishing rate. Assume that the thickness of a film to be polished of the wafer Wa has a thickness $T_0$ before polishing. First, the wafer Wa is polished for a period of polishing time (S1). A time $t_1$ is set to obtain a film slightly thicker than a target thickness $T_1$ after polishing. An actual film thickness $T_{11}$ after polishing is measured (S2). Then, a polishing rate $R_1$ is calculated using the above equation (1) (S3). A polishing time $t_2$, in which a next wafer $W_b$ is to be polished, is set in accordance with the polishing rate $R_1$. The polishing time $t_2$ is calculated, for example, on the basis of the following equation (2)(S4):

$$t_2 = (T_{11} - T_1)/R_1 + t_1 \qquad (2)$$

Then, the wafer $W_b$ is polished for a period of polishing time $t_2$ (S5). Thereafter, the thickness of the wafer $W_b$ is measured and the polishing rate $R_2$ is calculated on the basis of the equation (1)(S6). In this time, a polishing time $t_3$ of polishing a next wafer $W_c$ is obtained by the following equation (3):

$$t_3 = t_2 \times R_2/R_1 \qquad (3)$$

The subsequent wafers are polished in the same manner as described above (S7).

According to the above polishing method, the thickness of a polished film is measured and a period of time for polishing a next wafer is set on the basis of the measured thickness, even if the polishing conditions, such as the state of the polishing cloth, are changed, the film to be polished can be polished to a desired thickness.

In the above polishing method, it is possible that the thickness of the film is measured with respect to either every wafer or every a certain number of wafers.

Figure 2:
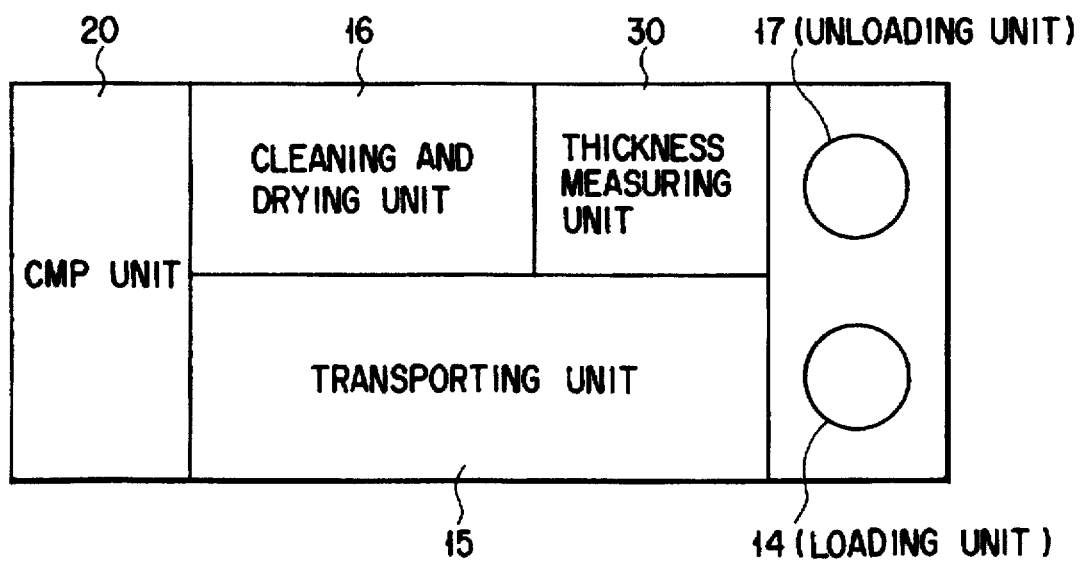
FIG. 2 is a schematic diagram showing a CMP apparatus according to the present invention.

A CMP apparatus for performing the above polishing method will now be described with reference to FIG. 2. The CMP apparatus of the present invention includes all of a CMP unit, a cleaning and drying unit and a thickness measuring unit. The CMP apparatus comprises a loading unit 14 for holding wafers to be polished, a CMP unit 20 for polishing the wafers, a transporting unit 15 for transporting the wafers from the loading unit 14 to the CMP unit 20, a cleaning and drying unit 16 for cleaning the polished wafers, a thickness measuring unit 30 for measuring the thickness of the polished wafers, and an unloading unit 17 for holding the polished wafers. The cleaning and drying unit 16 has a rinse stage, a scrubber cleaning stage, a scrubber and spin-dry stage, which are not shown. The thickness measuring unit 30 may be provided in the scrubber and spin-dry stage, or a stage before cleaning or another dedicated stage.

FIG. 3 shows the relationship between the CMP unit 20 and the thickness measuring unit 30, and the cleaning and drying unit 16 located therebetween is omitted. The CMP unit 20 comprises a base 21; a polishing cloth 22; a wafer holder 23, located above the base 21, for holding a wafer 10; and a slurry supplying pipe 25 for supplying slurry 24 onto the polishing cloth 22. The slurry 24 is dropped onto the polishing cloth 22 from the slurry supplying pipe 25. The wafer 10 is pressed against the polishing cloth 22 by the wafer holder 23. The surface of the wafer 10 is polished by the polishing cloth 22 and the slurry 24, while both the wafer holder 23 and the base are rotated.

The thickness measuring unit 30 comprises, for example, an optical sensor 31 and an optical sensor controller 32. In this embodiment, the optical sensor 31 emits a visible ray and applies it to the wafer, detects a reflected ray from the wafer, converts the detected ray to an electrical signal, which is output to the controller 32. The controller 32 measures the thickness of a film of the wafer on the basis of the electrical signal supplied from the optical sensor. A control unit 40 includes, for example, a microcomputer (μ-COMP), serving as an arithmetic unit, and is connected to the controller 32, the base 21, the wafer holder 23, and an apparatus (not shown) for controlling slurry supply. The control unit 40 executes the calculations expressed by the aforementioned equations (1) to (3) on the basis of data on the measured thickness supplied from the controller 32, thereby obtaining a polishing time. Based on the polishing time, the control unit 40 controls the operations of the base 21 and the wafer holder 23.

In the above structure, the polished wafer 10, held by the wafer holder 23, is cleaned and dried, and moved to a portion above the optical sensor 31. In this position, the thickness of the polished film of the wafer 10 is measured by the optical sensor 31 and the controller 32. The result of the measurement is supplied from the controller 32 to the control unit 40. The control unit 40, as described above, sets the polishing time for polishing a next wafer on the basis of the measurement value of the thickness of the polished film, and controls the base 21 and the wafer holder 23 in accordance with the set polishing time.

In a case where the thickness is to be measured at a specified electrode position, if the wafer is required to be positioned, it is only necessary that the wafer held by the wafer holder is moved to the specified position. Further, if an extremely accurate positioning is required, a dedicated measuring stage (not shown) may be provided.

Although the optical sensor is used as the thickness measuring unit 30 in the structure of FIG. 3, it is possible to use an X-ray measuring apparatus or a sheet resistance measuring apparatus, as described before.

As has been described above, according to the polishing method of the present invention, the polishing time can be set in accordance with the varying polishing rate. Thus, excess polishing or under-polishing is avoided, and a film of a uniform polarized shape can be obtained. In addition, according to the CMP apparatus of the present invention, the thickness of a polished film is automatically measured and the polishing time is controlled. It is therefore unnecessary for the operator to frequently measure the thickness and reset the polishing time unlike in the conventional method. Conventionally, since the operator performs an operation of changing the polishing time, each time several wafers have been polished, it required four hours or more to polish 24 wafers. However, according to the present invention, it required about only two hours to polish the same number of wafers. The apparatus of the throughput is thus increased twice or more. Moreover, the labor of the operator is greatly reduced, which allows labor saving.

What is claimed is:

1. A method for manufacturing a semiconductor device comprising the steps of:

polishing and planarizing a film formed on a surface of a first semiconductor body, the film having level-different portions on a surface thereof, a thickness of the film before polishing being $T_0$, and a polishing time being set to $t_1$;

measuring a first thickness $T_1$ of a polished film on the surface of the first semiconductor body;

calculating a polishing rate $R_1$ for polishing the first semiconductor body based on the first thickness $T_1$;

calculating a polishing time $t_2$ for polishing a second semiconductor body, in accordance with the first thickness $T_1$ and the polishing rate $R_1$, from the following equation:

$$t_2 = (T_{11} - T_1)/R_1 + t_1$$

($T_{11}$ is the thickness of the film after polishing);

polishing and planarizing a film on a surface of the second semiconductor body for the polishing time $t_2$;

measuring a second thickness of a polished film on the surface of the second semiconductor body;

calculating a polishing rate $R_2$ for polishing the second semiconductor body based on the second thickness; and calculating a polishing time $t_3$ for polishing a third semiconductor body, in accordance with the polishing rates $R_1$ and $R_2$ and the polishing time $t_2$, from the following equation:

$$t_3 = t_2 \times R_2 / R_1.$$

2. The method according to claim 1, wherein, in the measuring steps, the thickness of the polished film is measured by using light.

3. The method according to claim 2, wherein, in the measuring step, the thickness of the polished film is measured by using one of a visible ray, an infrared ray and an X ray.

4. The method according to claim 1, wherein the measuring steps are automatically performed within an apparatus for polishing the film.

5. The method according to claim 1, further comprising the steps of cleaning the semiconductor bodies after the respective polishing and planarizing steps.

6. The method according to claim 1, wherein the measuring steps are performed after the respective cleaning steps.

7. An apparatus for manufacturing a semiconductor device comprising:

a polishing unit for polishing a semiconductor body including a film having a difference in level to be polished;

a measuring unit for measuring a thickness of a polished film; and a control unit for calculating a time required for polishing a next film based on a measurement result measured by the measuring unit and controlling an operation of the polishing unit on the basis of the calculated time, wherein said control unit comprises a calculating device, and when the calculating device receives a thickness $T_1$ of a first semiconductor body from the measuring unit, it calculates a polishing rate $R_1$ for polishing the first semiconductor body based on the thickness $T_1$ and calculates a polishing time $t_2$ for polishing a second semiconductor body, in accordance with the thickness $T_1$ and the polishing rate $R_1$, from the following equation:

$$t_2 = (T_{11} - T_1)/R_1 + t_1$$

($T_{11}$ is the thickness of the film after polishing); and after the second semiconductor body is polished for the polishing time $t_2$, when the calculating device receives a second thickness of the second semiconductor body from the measuring unit, it calculates a polishing rate $R_2$ for polishing the second semiconductor body in accordance with the second thickness, and calculates a polishing time $t_3$ for polishing a third semiconductor body, in accordance with the polishing rates $R_1$ and $R_2$ and the polishing time $t_2$, from the following equation:

$$t_3 = t_2 \times R_2 / R_1.$$

8. The apparatus according to claim 7, wherein the measuring unit comprises an optical sensor using one of a visible ray and an infrared ray.

9. The apparatus according to claim 7, wherein the measuring unit comprises a thickness measuring device using an X ray.

10. The apparatus according to claim 7, further comprising a cleaning unit, located between the polishing unit and the measuring unit, for cleaning the semiconductor body.

* * * * *